US012614601B2

(12) United States Patent
Choi et al.

(10) Patent No.: US 12,614,601 B2
(45) Date of Patent: *Apr. 28, 2026

(54) MEMORY APPARATUS AND SEMICONDUCTOR SYSTEM INCLUDING THE SAME

(71) Applicant: SK hynix Inc., Icheon-si Gyeonggi-do (KR)

(72) Inventors: Heeeun Choi, Icheon-si Gyeonggi-do (KR); Yeong Han Jeong, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 107 days.

This patent is subject to a terminal disclaimer.

(21) Appl. No.: 18/583,294

(22) Filed: Feb. 21, 2024

(65) Prior Publication Data

US 2024/0194285 A1 Jun. 13, 2024

Related U.S. Application Data

(63) Continuation of application No. 17/473,299, filed on Sep. 13, 2021, now Pat. No. 11,942,173.

(30) Foreign Application Priority Data

Apr. 19, 2021 (KR) ........................ 10-2021-0050403

(51) Int. Cl.
| | |
|---|---|
| *G11C 11/00* | (2006.01) |
| *G11C 29/00* | (2006.01) |
| *G11C 29/18* | (2006.01) |
| *G11C 29/36* | (2006.01) |
| *G11C 29/42* | (2006.01) |

(52) U.S. Cl.
CPC .............. *G11C 29/42* (2013.01); *G11C 29/18* (2013.01); *G11C 29/36* (2013.01); *G11C 29/785* (2013.01); *G11C 2029/1802* (2013.01)

(58) Field of Classification Search
CPC ......... G11C 29/42; G11C 29/18; G11C 29/36; G11C 29/785; G11C 2029/1802
See application file for complete search history.

(56) References Cited

U.S. PATENT DOCUMENTS

| | | | |
|---|---|---|---|
| 10,248,521 B2 | 4/2019 | Catherwood et al. | |
| 11,942,173 B2 * | 3/2024 | Choi .................... | G11C 29/785 |
| 2003/0164510 A1 | 9/2003 | Dono | |
| 2005/0281112 A1 | 12/2005 | Ito et al. | |
| 2007/0171737 A1 * | 7/2007 | Mito ................... | G06F 11/1048 |
| | | | 714/E11.049 |
| 2008/0071967 A1 * | 3/2008 | Oshikiri ................. | G06F 12/02 |
| | | | 711/E12.001 |

(Continued)

FOREIGN PATENT DOCUMENTS

KR 1020190033410 A 3/2019

*Primary Examiner* — Pho M Luu
(74) *Attorney, Agent, or Firm* — WILLIAM PARK AND ASSOCIATES LTD.

(57) ABSTRACT

A memory apparatus includes an address decoding circuit configured to output a test redundancy address based on an address that is transmitted from a memory controller; and a redundancy address check circuit configured to determine whether the test redundancy address is replacing a failed address, in order to perform an ECC test operation by using the test redundancy address.

15 Claims, 7 Drawing Sheets

(56)                    References Cited

U.S. PATENT DOCUMENTS

| 2013/0314992 | A1* | 11/2013 | Takagiwa ............... | H10B 43/27 |
| | | | | 365/185.09 |
| 2017/0017546 | A1 | 1/2017 | Qidwai et al. | |
| 2017/0110206 | A1 | 4/2017 | Ryu et al. | |

* cited by examiner

FIG. 1

MEMORY APPARATUS AND SEMICONDUCTOR SYSTEM INCLUDING THE SAME

CROSS-REFERENCES TO RELATED APPLICATION

The present application is a continuation application of U.S. patent application Ser. No. 17/473,299, filed on Sep. 13, 2021, and claims priority under 35 U.S.C. § 119(a) to Korean application number 10-2021-0050403, filed on Apr. 19, 2021, in the Korean Intellectual Property Office, which is incorporated herein by reference in its entirety.

BACKGROUND

1. Technical Field

Various embodiments generally relate to an integrated circuit technology, and more particularly, to a memory apparatus and a semiconductor system using the same.

2. Related Art

Each of electronic apparatuses may include a number of electronic components. Among the electronic apparatuses, a computer system may include a number of electronic components which are configured by semiconductors. Among semiconductor apparatuses configuring the computer system, a host such as a processor or a memory controller may perform data communication with a memory apparatus. The memory apparatus may store data by including a plurality of memory cells each of which may be specified by a word line and a bit line. The memory apparatus may include therein an error correcting code (ECC) circuit to ensure the reliability of data. The ECC circuit may generate parity data when data is stored in the memory apparatus and may correct an error in the data by using the parity data when the data is read. In order to test whether the ECC circuit of the memory apparatus normally performs an error correction operation, the host may perform an ECC test operation. The ECC test operation may be performed by intentionally inserting an error into data to be stored in the memory apparatus and checking whether the ECC circuit appropriately corrects the error.

SUMMARY

In an embodiment, a memory apparatus may include: an address decoding circuit configured to output a test redundancy address based on an address that is transmitted from a memory controller; and a redundancy address check circuit configured to determine whether the test redundancy address is replacing a failed address, in order to perform an ECC test operation by using the test redundancy address.

In an embodiment, a memory apparatus may include: a plurality of redundancy regions; and a redundancy address check circuit configured to determine whether a test redundancy address is usable for an ECC test operation, by comparing the test redundancy address with a reference address, among a plurality of redundancy addresses, corresponding to the redundancy regions.

In an embodiment, a semiconductor system may include: a memory apparatus with an ECC circuit, the memory apparatus configured to perform an ECC test operation for the ECC circuit; and a memory controller configured to transmit an address to the memory apparatus for the ECC test operation, wherein the memory apparatus determines a test redundancy address that corresponds to the address and outputs a warning signal to the memory controller when it is determined that the test redundancy address is unusable for the ECC test operation.

BRIEF DESCRIPTION OF THE DRAWINGS

FIG. 1 is a diagram illustrating a configuration of a semiconductor system in accordance with an embodiment of the present disclosure.

DETAILED DESCRIPTION

Figure 2A:
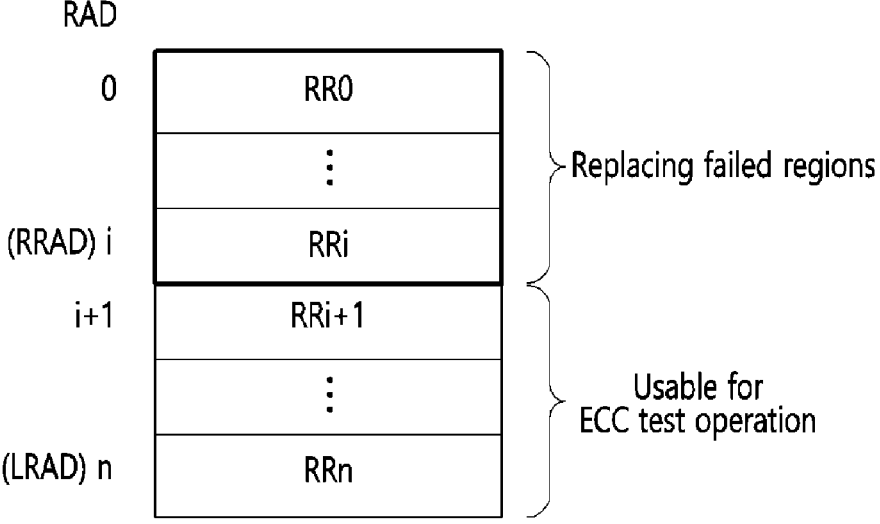
FIG. 2A is a diagram illustrating a method of using redundancy regions in accordance with an embodiment of the present disclosure.

Hereinafter, a memory apparatus and a semiconductor system including the same will be described below with reference to the accompanying drawings through various examples of embodiments.

Various embodiments are directed to providing a memory apparatus which efficiently performs an ECC test operation without affecting the memory capacity of the memory apparatus, and a semiconductor system including the same.

The memory apparatus and the semiconductor system including the same according to the embodiments of the present disclosure may efficiently perform an ECC test operation without affecting the memory capacity of the memory apparatus.

Figure 1:
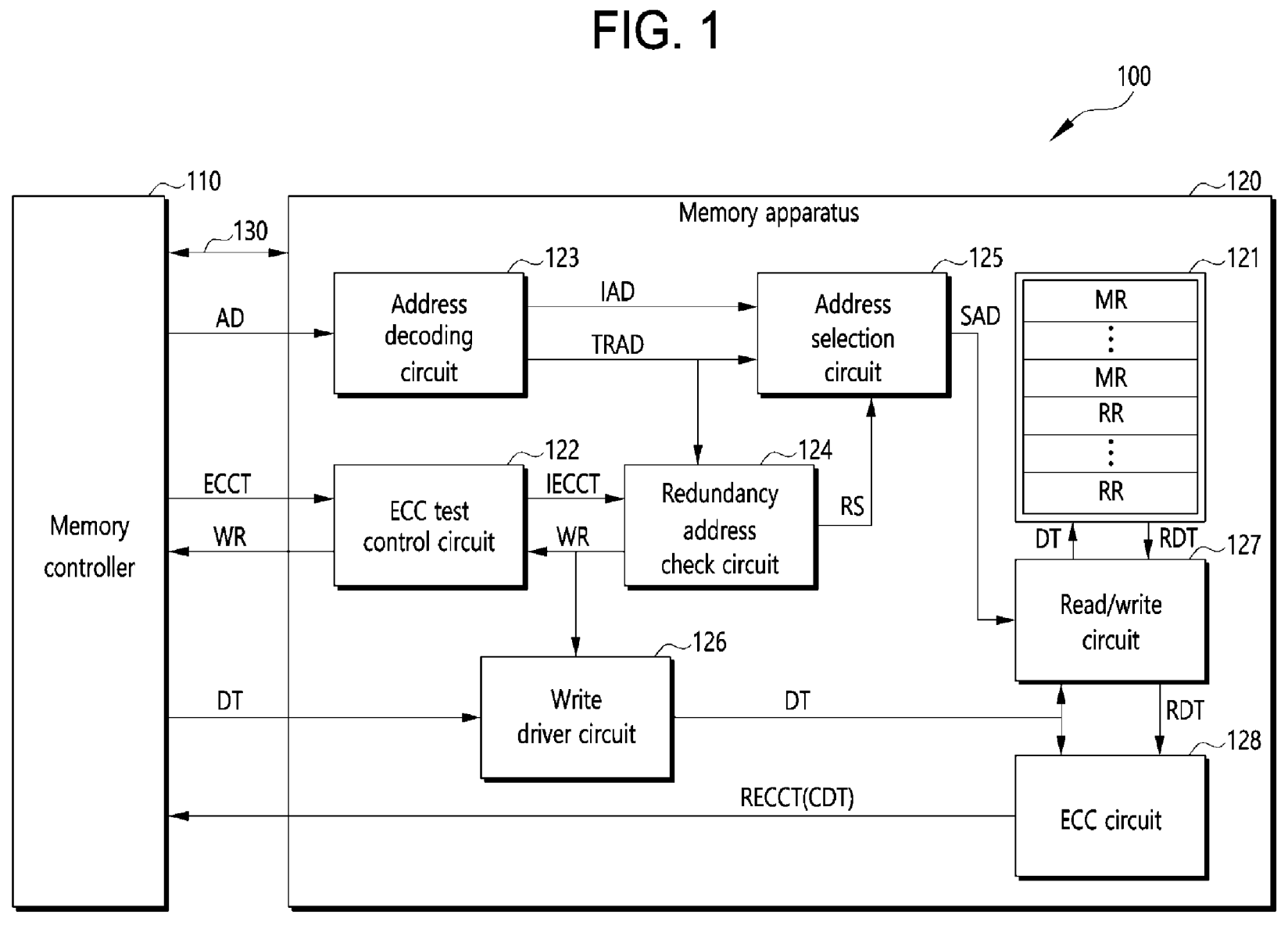

FIG. 1 is a diagram illustrating a configuration of a semiconductor system 100 in accordance with an embodiment of the present disclosure.

Referring to FIG. 1, the semiconductor system 100 may include a memory controller 110 and a memory apparatus 120. The memory controller 110 may provide various control signals that are necessary for the memory apparatus 120 to operate. The memory controller 110 may be built in various types of host devices. Examples of the host devices may include a central processing unit (CPU), a graphics processing unit (GPU), a multimedia processor (MMP), a digital signal processor and an application processor (AP). In an embodiment, the memory controller 110 together with the memory apparatus 120 may be stacked on one substrate and may be packaged into a single package. Examples of the memory apparatus 120 may include a DRAM (dynamic random access memory), an SRAM (static random access memory), a flash memory, an FeRAM (ferroelectric random access memory), a PCRAM (phase-change random access memory), an MRAM (magnetic random access memory) and an ReRAM (resistive random access memory).

The memory controller 110 may be coupled to the memory apparatus 120 through one or more buses 130. The buses 130 may be signal transmission paths, links, or channels for transmitting signals. The memory controller 110 may transmit signals, such as commands, addresses, and data, to the memory apparatus 120 through the buses 130 and may receive various signals, including data, from the memory apparatus 120 through the buses 130.

The memory controller 110 may control the memory apparatus 120 so that the memory apparatus 120 performs an error correcting code (ECC) test operation. The ECC test operation may be for testing whether an ECC circuit 128 in the memory apparatus 120 normally performs an error correction operation. In order to instruct the memory apparatus 120 to perform the ECC test operation, the memory controller 110 may transmit an ECC test signal ECCT to the memory apparatus 120. The ECC test signal ECCT may be a signal for setting a mode register (not illustrated) in the memory apparatus 120 to a predetermined value so that the memory apparatus 120 performs the ECC test operation. The ECC test signal ECCT may be a predetermined command that instructs the memory apparatus 120 to perform the ECC test operation.

The memory controller 110 may transmit an address AD to the memory apparatus 120 for the ECC test operation. The address AD may correspond to any one of the main regions MR in the memory apparatus 120. The address AD may be a row address. When receiving a warning signal WR from the memory apparatus 120 that indicates that the address AD is unusable for the ECC test operation, the memory controller 110 may transmit an address AD that is different from the unusable address AD to the memory apparatus 120. When receiving a result RECCT of the ECC test operation instead of the warning signal WR from the memory apparatus 120, the memory controller 110 may separately store the address AD and may transmit the stored address AD to the memory apparatus 120 when the ECC test operation is performed again later. That is to say, when it is determined that the address AD is usable for the ECC test operation, the memory controller 110 may separately store the address AD for reuse.

The memory controller 110 may further transmit data DT to the memory apparatus 120 for the ECC test operation of the memory apparatus 120. The memory controller 110 may receive error-corrected data CDT that is included in the result RECCT of the ECC test operation from the memory apparatus 120. By comparing the error-corrected data CDT with the data DT, the memory controller 110 may determine whether the ECC circuit 128 normally performs the error correction operation. For example, when the error-corrected data CDT is the same as the data DT, the memory controller 110 may determine that the ECC circuit 128 is normally performing the error correction operation, and, when the error-corrected data CDT is different from the data DT, the memory controller 110 may determine that the ECC circuit 128 is not normally performing the error correction operation.

The memory apparatus 120 may operate based on the memory controller 110. The memory apparatus 120 may include a memory cell array 121, an ECC test control circuit 122, an address decoding circuit 123, a redundancy address check circuit 124, an address selection circuit 125, a write driver circuit 126, a read/write circuit 127, and the ECC circuit 128.

A plurality of word lines and a plurality of bit lines may be disposed in the memory cell array 121, and a plurality of memory cells may be coupled to points in which the plurality of word lines and the plurality of bit lines intersect with each other. The memory cell array 121 may include the main regions MR and redundancy regions RR. The redundancy regions RR may be used to replace failed regions among the main regions MR. The main regions MR may correspond to different main addresses, respectively, and the redundancy regions RR may correspond to different redundancy addresses, respectively. The main addresses and the redundancy addresses may be, for example, row addresses.

In response to the ECC test signal ECCT, the ECC test control circuit 122 may control general operations of the internal units of the memory apparatus 120 so that the internal units of the memory apparatus 120 perform the ECC test operation. The ECC test control circuit 122 may output (or enable) an internal ECC test signal IECCT in response to the ECC test signal ECCT. The ECC test control circuit 122 may transmit the warning signal WR, transmitted from the redundancy address check circuit 124, to the memory controller 110.

The address decoding circuit 123 may receive the address AD and may output an internal address IAD and a test redundancy address TRAD that corresponds to the address AD.

The internal address IAD may correspond to any one of the main regions MR and the redundancy regions RR. The internal address IAD may be any one of main addresses of the main regions MR and redundancy addresses of the redundancy regions RR. When it is determined that a main address that is transmitted as the address AD is a failed address, the address decoding circuit 123 may output a redundancy address that is replacing the address AD as the internal address IAD. When it is determined that a main address that is transmitted as the address AD is not a failed address, the address decoding circuit 123 may output the address AD as the internal address IAD.

The test redundancy address TRAD may correspond to any one of the redundancy regions RR. The test redundancy address TRAD may be any one of the redundancy addresses of the redundancy regions RR. The address decoding circuit 123 may determine and output the test redundancy address TRAD that corresponds to the address AD according to a predetermined rule. For example, the address decoding circuit 123 may output the test redundancy address TRAD as the same value as the address AD, but the embodiment of the present disclosure is not limited thereto.

The address decoding circuit 123 may output the internal address IAD and the test redundancy address TRAD regardless of whether the ECC test operation is being performed. According to an embodiment, the address decoding circuit 123 may output only the internal address IAD when the ECC test operation is not performed and may output the internal address IAD and the test redundancy address TRAD when the ECC test operation is performed. For example, the address decoding circuit 123 may receive the internal ECC test signal IECCT, may output only the internal address IAD when the internal ECC test signal IECCT is disabled, and may output the internal address IAD and the test redundancy address TRAD when the internal ECC test signal IECCT is enabled.

The redundancy address check circuit 124 may operate in the ECC test operation in response to the internal ECC test signal IECCT. The redundancy address check circuit 124 might not operate when the internal ECC test signal IECCT is disabled, and may operate when the internal ECC test signal IECCT is enabled. The redundancy address check circuit 124 may receive the test redundancy address TRAD in the ECC test operation, may determine whether the test redundancy address TRAD is usable for the ECC test operation, and may output (or enable) a redundancy select signal RS and the warning signal WR depending on a determination result. The redundancy address check circuit 124 might not output (or disable) the redundancy select signal RS and the warning signal WR when the ECC test operation is not performed.

In detail, by determining whether the test redundancy address TRAD is replacing a failed address, the redundancy address check circuit 124 may determine whether the test redundancy address TRAD is usable for the ECC test operation. When the test redundancy address TRAD is not replacing a failed address, the redundancy address check circuit 124 may determine that the test redundancy address TRAD is usable for the ECC test operation. When it is determined that the test redundancy address TRAD is usable for the ECC test operation, the redundancy address check circuit 124 may output (or enable) the redundancy select signal RS and might not output (or disable) the warning signal WR. When the test redundancy address TRAD is replacing a failed address, the redundancy address check circuit 124 may determine that the test redundancy address TRAD is unusable for the ECC test operation. When it is determined that the test redundancy address TRAD is unusable for the ECC test operation, the redundancy address check circuit 124 might not output (or disable) the redundancy select signal RS and may output (or enable) the warning signal WR.

In order to determine whether the test redundancy address TRAD is replacing a failed address, the redundancy address check circuit 124 may compare the test redundancy address TRAD with a reference address among the redundancy addresses of the redundancy regions RR. The reference address may be the redundancy address that was most recently used to replace a failed address. In order to determine whether the test redundancy address TRAD is replacing a failed address, the redundancy address check circuit 124 may further compare the test redundancy address TRAD with a last redundancy address among the redundancy addresses of the redundancy regions RR.

The address selection circuit 125 may receive the internal address IAD and the test redundancy address TRAD and may output any one of the internal address IAD and the test redundancy address TRAD as an output address SAD in response to the redundancy select signal RS. For example, the address selection circuit 125 may receive the internal address IAD and the test redundancy address TRAD and may output the internal address IAD when the redundancy select signal RS is disabled. On the other hand, the address selection circuit 125 may receive the internal address IAD and the test redundancy address TRAD and may output the test redundancy address TRAD when the redundancy select signal RS is enabled.

The write driver circuit 126 may receive the data DT and may transmit the data DT to the ECC circuit 128 and the read/write circuit 127 by driving the data DT based on the warning signal WR. The write driver circuit 126 may transmit the data DT to the ECC circuit 128 and the read/write circuit 127 when the warning signal WR is disabled. The write driver circuit 126 might not transmit the data DT to the ECC circuit 128 and the read/write circuit 127 when the warning signal WR is enabled. According to an embodiment, the write driver circuit 126 might not receive the warning signal WR directly from the redundancy address check circuit 124 and may receive the warning signal WR through the ECC test control circuit 122.

The read/write circuit 127 may access a region that corresponds to the output address SAD among the main regions MR and the redundancy regions RR. The read/write circuit 127 may store the data DT, transmitted from the write driver circuit 126, in the region that corresponds to the output address SAD and may read the read data RDT from the region that corresponds to the output address SAD. When the address selection circuit 125 outputs the internal address IAD, the read/write circuit 127 may access a region that corresponds to the internal address IAD among the main regions MR and the redundancy regions RR. When the address selection circuit 125 outputs the test redundancy address TRAD, the read/write circuit 127 may access a redundancy region RR that corresponds to the test redundancy address TRAD among the redundancy regions RR.

The ECC circuit 128 may receive the data DT that is transmitted by the write driver circuit 126 and may generate error detection data (e.g., parity data) that corresponds to the data DT. The ECC circuit 128 may receive the read data RDT that is outputted by the read/write circuit 127, may correct an error in the read data RDT based on the error detection data, and may output the error-corrected data CDT. The error-corrected data CDT may be outputted to the memory controller 110 as the result RECCT of the ECC test operation.

In the ECC test operation, an error may be introduced into the data DT in various ways. For example, an error may be overwritten to the data DT that is stored in a memory cell. For example, an error may be introduced in the read/write circuit 127 before the data DT is stored in a memory cell. Meanwhile, the parity data may be generated before an error is introduced into the data DT and might not be updated even when an error is introduced into the data DT. Therefore, an error that is included in the read data RDT may be corrected by the parity data.

The memory apparatus 120 may access the memory cell array 121 in the following manner. When the ECC test operation is not being performed, the address selection circuit 125 may output the internal address IAD in response to the disabled redundancy select signal RS, and the read/write circuit 127 may access a region that corresponds to the internal address IAD among the main regions MR and the redundancy regions RR. When the ECC test operation is being performed, if the redundancy address check circuit 124 determines that the test redundancy address TRAD is usable for the ECC test operation, the address selection circuit 125 may output the test redundancy address TRAD in response to the enabled redundancy select signal RS, and the read/write circuit 127 may access a redundancy region RR that corresponds to the test redundancy address TRAD among the redundancy regions RR. When the ECC test operation is being performed, if the redundancy address check circuit 124 determines that the test redundancy address TRAD is unusable for the ECC test operation, the address selection circuit 125 may output the internal address IAD in response to the disabled redundancy select signal RS. However, since the write driver circuit 126 does not operate in response to the enabled warning signal WR, the read/write circuit 127 might not store the data DT in a region that corresponds to the internal address IAD.

According to an embodiment, when the memory apparatus 120 includes a plurality of banks and each of the banks includes the redundancy regions RR and the ECC circuit 128, the ECC test operation may be performed for each of the banks according to the above-described method.

Thus, according to the present disclosure, when the ECC test operation is performed, redundancy regions RR that are not replacing a failed region may be used, and thus, the capacity of the main regions MR might not be affected. Also, according to the present disclosure, even when the main regions MR are full of data, the ECC test operation may be possible using the redundancy regions RR. In addition, according to the present disclosure, by efficiently determining whether the test redundancy address TRAD is replacing a failed address, it is possible to prevent data stored in redundancy regions RR from being damaged due to the ECC test operation.

Figure 2B:
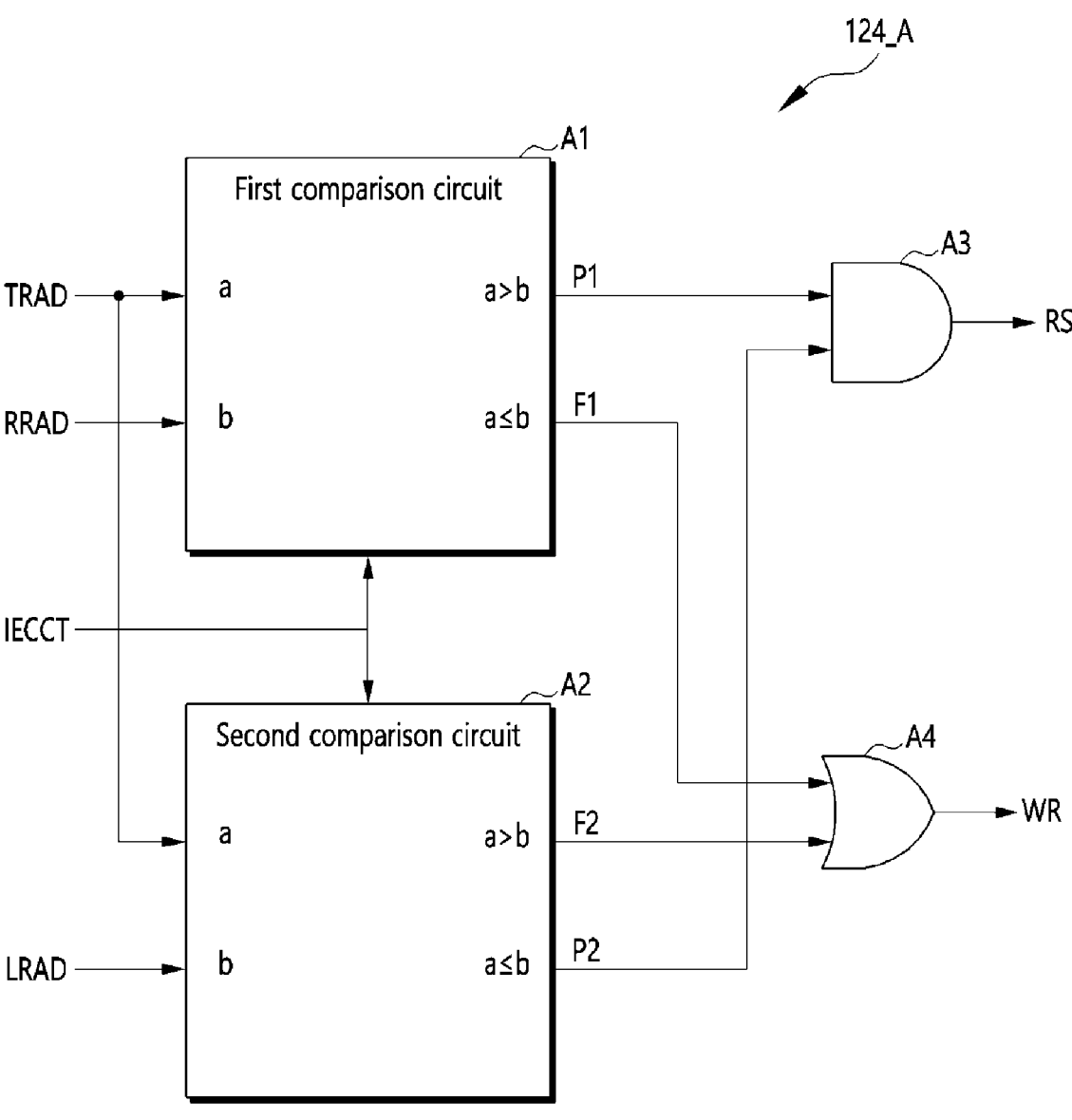
FIGS. 2B and 2C are diagrams illustrating configurations of redundancy address check circuits in accordance with embodiments of the present disclosure.
Figure 2C:
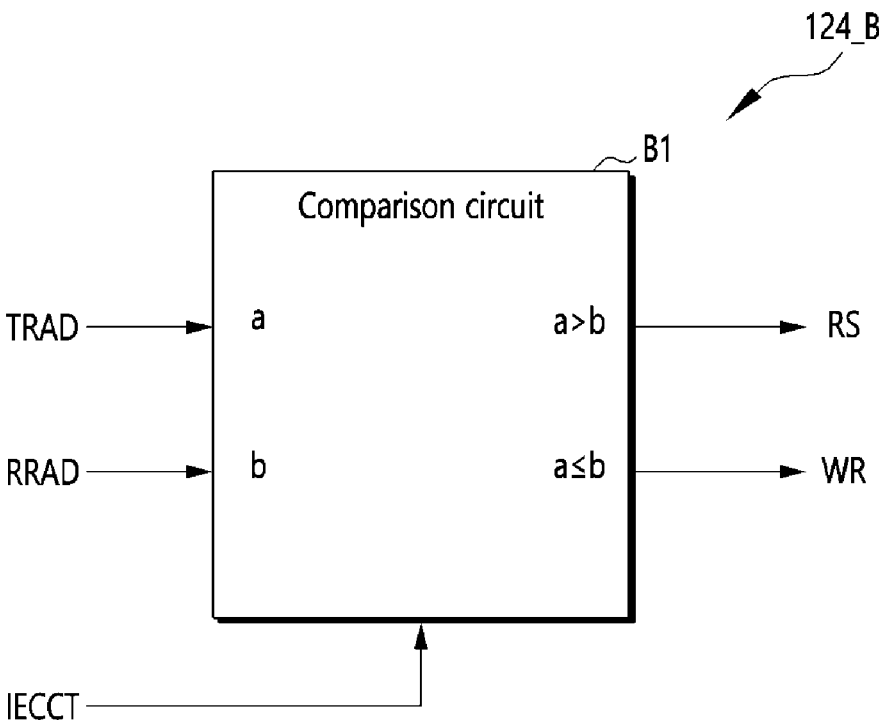

FIG. 2A is a diagram illustrating a method of using redundancy regions RR0 to RRn in accordance with an embodiment of the present disclosure. FIGS. 2B and 2C are diagrams illustrating configurations of the redundancy address check circuit 124 in accordance with embodiments of the present disclosure.

Referring to FIG. 2A, the redundancy regions RR0 to RRn may correspond to redundancy addresses RAD, respectively, from a first redundancy address 0 to a last redundancy address (LRAD) n in an address order. Each of the redundancy regions RR0 to RRn may be accessed through a corresponding redundancy address RAD. When any one of the redundancy addresses RAD is inputted, the read/write circuit 127 may access a corresponding redundancy region among the redundancy regions RR0 to RRn.

The redundancy regions RR0 to RRn may be provided to replace (or repair) a failed region among the main regions MR. There may be a failed region not only during the manufacturing step of the memory apparatus 120, but also during the use of the memory apparatus 120. When there is a failed region (or a failed address), the first redundancy region RR0 (or the first redundancy address 0) among the redundancy regions RR0 to RRn may be first used to replace the failed region (or the failed address). As a result, when the redundancy addresses RAD from 0 to i are replacing failed addresses, the redundancy address i may be the redundancy address that was most recently used to replace a failed address (hereinafter, referred to as a reference redundancy address RRAD).

Therefore, since the redundancy addresses RAD from 0 to i are replacing failed addresses, the redundancy address check circuit 124 may determine that the redundancy addresses RAD from 0 to i are unusable for the ECC test operation. However, since the redundancy addresses RAD from i+1 to n are not replacing failed addresses, the redundancy address check circuit 124 may determine that the redundancy addresses RAD from i+1 to n are usable for the ECC test operation.

Referring to FIG. 2B, a redundancy address check circuit 124_A may be an embodiment of the redundancy address check circuit 124 of FIG. 1. The redundancy address check circuit 124_A may determine whether the test redundancy address TRAD is one of the redundancy addresses RAD from i+1 to n. In other words, the redundancy address check circuit 124_A may determine whether the test redundancy address TRAD is one of the redundancy addresses RAD based on the redundancy address i+1 that is next to the reference redundancy address RRAD to the last redundancy address LRAD n. Depending on a determination result, the redundancy address check circuit 124_A may output (or enable) the redundancy select signal RS or output (or enable) the warning signal WR.

The redundancy address check circuit 124_A may include a first comparison circuit A1, a second comparison circuit A2, an AND gate A3 and an OR gate A4.

The first comparison circuit A1 and the second comparison circuit A2 may operate in response to the internal ECC test signal IECCT. When the internal ECC test signal IECCT is disabled, the first comparison circuit A1 might not output (or may disable) a first pass signal P1 and a first fail signal F1. When the internal ECC test signal IECCT is disabled, the second comparison circuit A2 might not output (or may disable) a second pass signal P2 and a second fail signal F2.

When the internal ECC test signal IECCT is enabled, the first comparison circuit A1 may compare the test redundancy address TRAD and the reference redundancy address RRAD and may output the first pass signal P1 and the first fail signal F1 based on a comparison result. When the test redundancy address TRAD is later in the address order than the reference redundancy address RRAD, the first comparison circuit A1 may enable the first pass signal P1 and disable the first fail signal F1. When the test redundancy address TRAD is earlier in the address order than or equal to the reference redundancy address RRAD, the first comparison circuit A1 may enable the first fail signal F1 and disable the first pass signal P1.

When the internal ECC test signal IECCT is enabled, the second comparison circuit A2 may compare the test redundancy address TRAD and the last redundancy address LRAD and may output the second pass signal P2 and the second fail signal F2 based on a comparison result. When the test redundancy address TRAD is earlier in the address order than or equal to the last redundancy address LRAD, the second comparison circuit A2 may enable the second pass signal P2 and disable the second fail signal F2. When the test redundancy address TRAD is later in the address order than the last redundancy address LRAD, the second comparison circuit A2 may enable the second fail signal F2 and disable the second pass signal P2.

The AND gate A3 may receive the first pass signal P1 and the second pass signal P2 and may output the redundancy select signal RS. The AND gate A3 may enable the redundancy select signal RS when both the first pass signal P1 and the second pass signal P2 are enabled.

The OR gate A4 may receive the first fail signal F1 and the second fail signal F2 and may output the warning signal WR. The OR gate A4 may enable the warning signal WR when the first fail signal F1 or the second fail signal F2 is enabled.

The redundancy address check circuit 124_A may compare the test redundancy address TRAD with the last redundancy address LRAD through the second comparison circuit A2 in preparation for a case in which the address decoding circuit 123 does not output the test redundancy address TRAD as one of the 0 to n redundancy addresses RAD. According to an embodiment, the address decoding circuit 123 may follow a rule of outputting the test redundancy address TRAD necessarily as one of the 0 to n redundancy addresses RAD. In this case, a redundancy address check circuit 124_B may be configured as illustrated in FIG. 2C.

Referring to FIG. 2C, the redundancy address check circuit 124_B may be an embodiment of the redundancy address check circuit 124 of FIG. 1. The redundancy address check circuit 124_B may include a comparison circuit B1. The comparison circuit B1 may operate in response to the internal ECC test signal IECCT. When the internal ECC test signal IECCT is disabled, the comparison circuit B1 might not output (or may disable) the redundancy select signal RS and the warning signal WR. When the internal ECC test signal IECCT is enabled, the comparison circuit B1 may compare the test redundancy address TRAD and the reference redundancy address RRAD and may output (or enable) the redundancy select signal RS or the warning signal WR based on a comparison result. When the test redundancy address TRAD is later in the address order than the reference redundancy address RRAD, the comparison circuit B1 may enable the redundancy select signal RS and disable the warning signal WR. When the test redundancy address TRAD is earlier in the address order than or equal to the reference redundancy address RRAD, the comparison circuit B1 may enable the warning signal WR and disable the redundancy select signal RS.

Figure 3A:
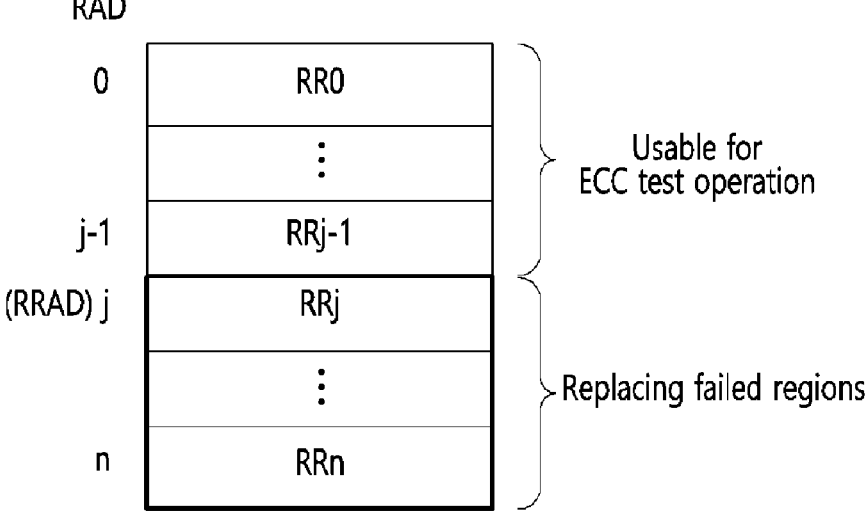
FIG. 3A is a diagram illustrating a method of using redundancy regions in accordance with an embodiment of the present disclosure.
Figure 3B:
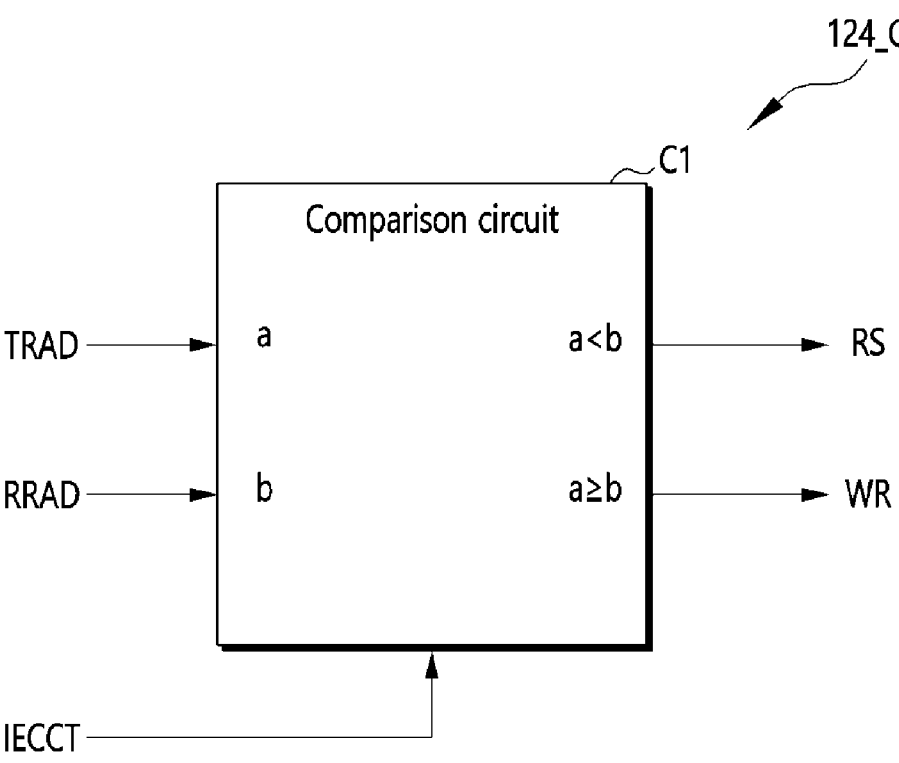
FIG. 3B is a diagram illustrating a configuration of a redundancy address check circuit in accordance with an embodiment of the present disclosure.

FIG. 3A is a diagram illustrating a method of using redundancy regions RR0 to RRn in accordance with an embodiment of the present disclosure. FIG. 3B is a diagram illustrating a configuration of the redundancy address check circuit 124 in accordance with an embodiment of the present disclosure.

Referring to FIG. 3A, when there is a failed region (or a failed address), as opposed to the illustration of FIG. 2A, a last redundancy region RRn (or a last redundancy address n) among the redundancy regions RR0 to RRn may be first used to replace the failed region (or the failed address). As a result, when redundancy addresses RAD from n to j are replacing failed addresses, the redundancy address j may be the reference redundancy address RRAD that was most recently used to replace a failed address.

Therefore, since the redundancy addresses RAD from n to j are replacing failed addresses, the redundancy address check circuit 124 may determine that the redundancy addresses RAD from n to j are unusable for the ECC test operation. However, since redundancy addresses RAD from j−1 to 0 are not replacing failed addresses, the redundancy address check circuit 124 may determine that the redundancy addresses RAD from j−1 to 0 are usable for the ECC test operation.

Referring to FIG. 3B, a redundancy address check circuit 124_C may be an embodiment of the redundancy address check circuit 124 of FIG. 1. The redundancy address check circuit 124_C may include a comparison circuit C1. The comparison circuit C1 may operate in response to the internal ECC test signal IECCT. When the internal ECC test signal IECCT is disabled, the comparison circuit C1 might not output (or may disable) the redundancy select signal RS and the warning signal WR. When the internal ECC test signal IECCT is enabled, the comparison circuit C1 may compare the test redundancy address TRAD and the reference redundancy address RRAD, and may output (or enable) the redundancy select signal RS or the warning signal WR depending on a comparison result. When the test redundancy address TRAD is earlier in the address order than the reference redundancy address RRAD, the comparison circuit C1 may enable the redundancy select signal RS and disable the warning signal WR. When the test redundancy address TRAD is later in the address order than or the same as the reference redundancy address RRAD, the comparison circuit C1 may enable the warning signal WR and disable the redundancy select signal RS.

Figure 4:
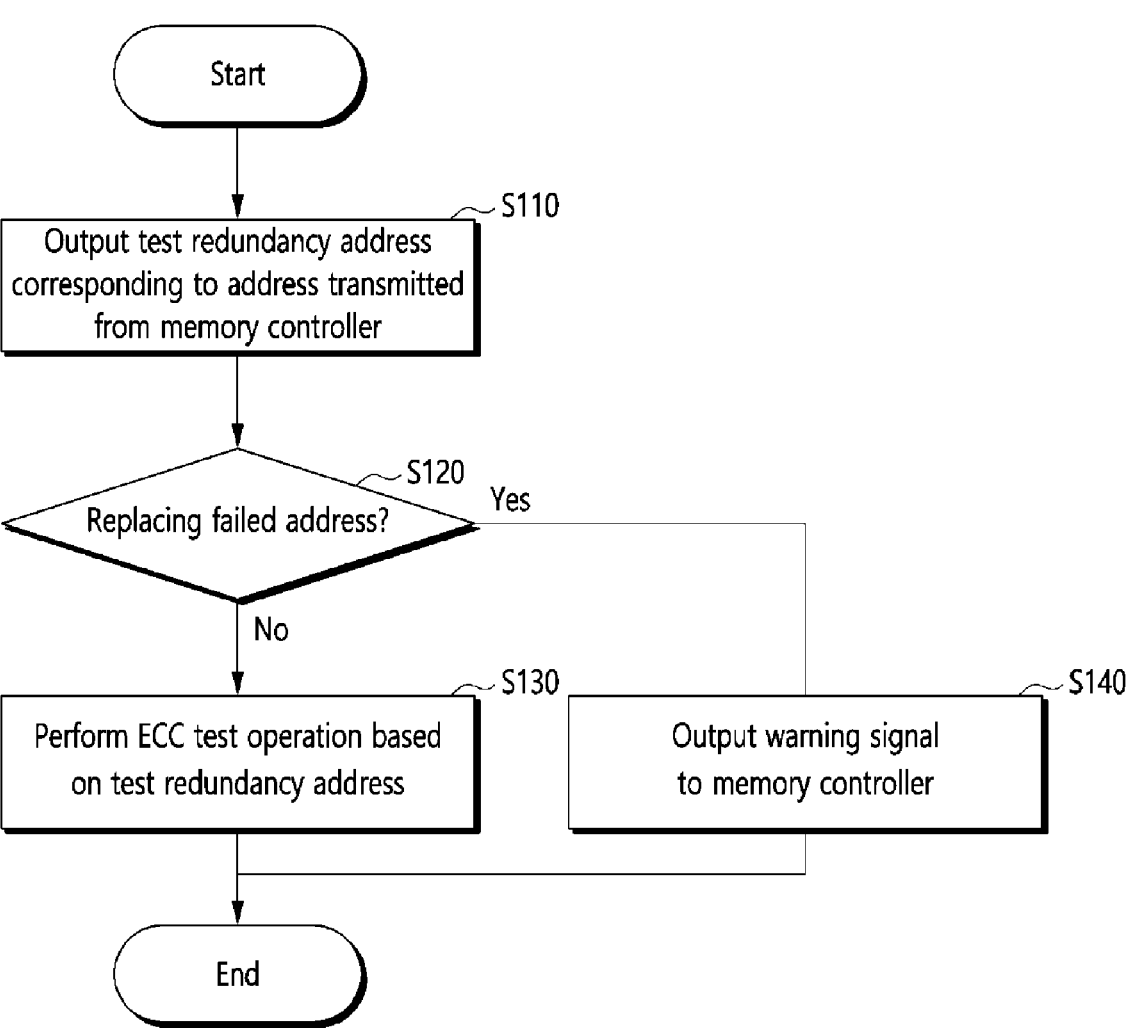
FIG. 4 is a flowchart illustrating a method for a memory apparatus to perform an ECC test operation in accordance with an embodiment of the present disclosure.

FIG. 4 is a flowchart illustrating a method for the memory apparatus 120 to perform the ECC test operation in accordance with an embodiment of the present disclosure.

Referring to FIG. 4, at step S110, the address decoding circuit 123 may output the test redundancy address TRAD corresponding to the address AD that is transmitted from the memory controller 110.

At step S120, the redundancy address check circuit 124 may determine whether the test redundancy address TRAD is replacing a failed address. When the test redundancy address TRAD is not replacing a failed address, the process may proceed to step S130. When the test redundancy address TRAD is replacing a failed address, the process may proceed to step S140.

At step S130, the memory apparatus 120 may perform the ECC test operation based on the test redundancy address TRAD. By storing the data DT for the ECC test operation in a redundancy region that corresponds to the test redundancy address TRAD and performing the error correction operation on the read data RDT that is read from the corresponding redundancy region, the memory apparatus 120 may perform the ECC test operation. The redundancy region that corresponds to the test redundancy address TRAD may store error-introduced data.

At step S140, the memory apparatus 120 may output the warning signal WR to the memory controller 110 and might not perform the ECC test operation.

Figure 5:
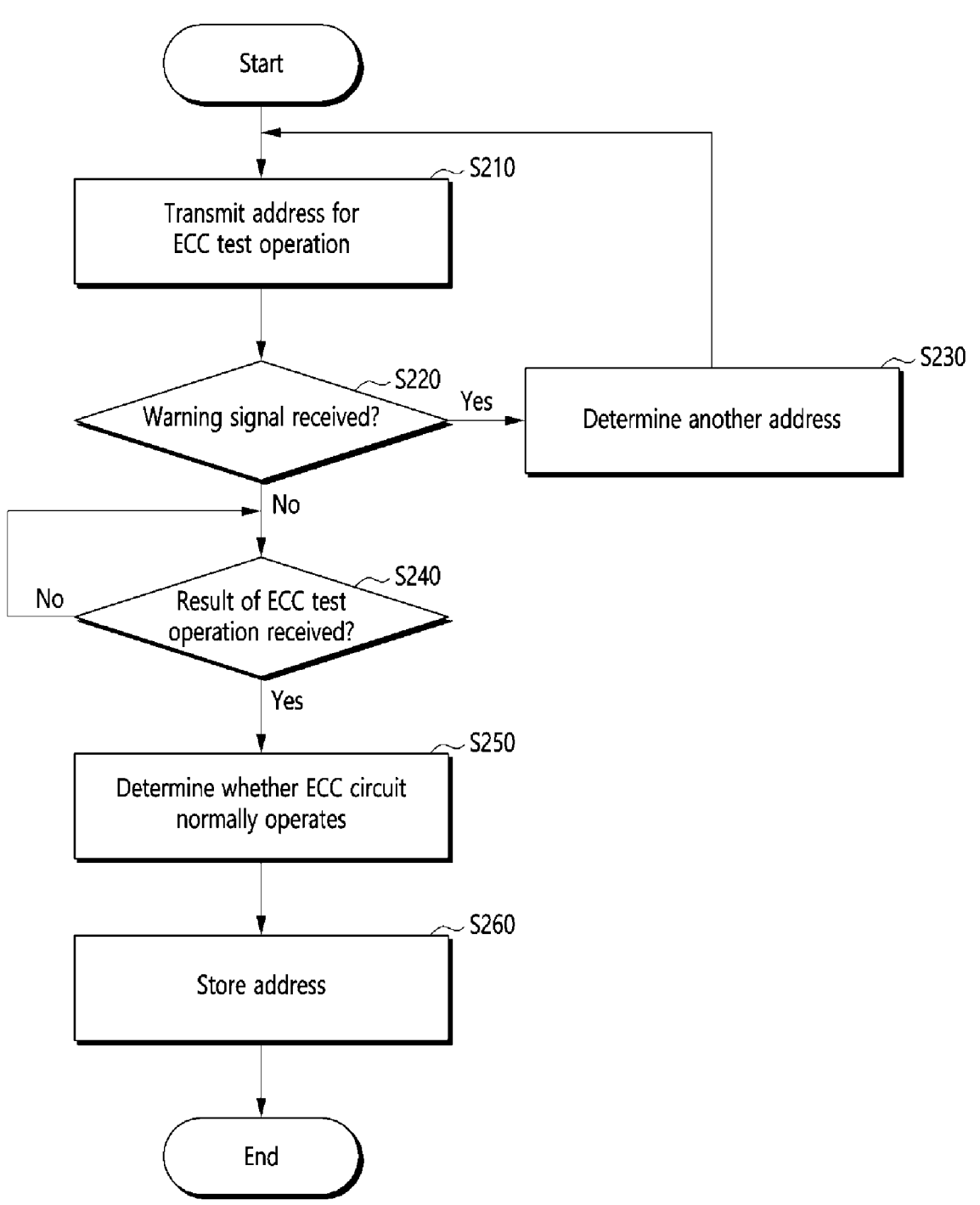
FIG. 5 is a flowchart illustrating a method for a memory controller to control an ECC test operation of a memory apparatus in accordance with an embodiment of the present disclosure.

FIG. 5 is a flowchart illustrating a method for the memory controller 110 to control the ECC test operation of the memory apparatus 120 in accordance with an embodiment of the present disclosure.

Referring to FIG. 5, at step S210, in order for the ECC test operation, the memory controller 110 may transmit the address AD to the memory apparatus 120. The memory apparatus 120 may perform the ECC test operation according to the process illustrated in FIG. 4.

At step S220, the memory controller 110 may determine whether the warning signal WR is received from the memory apparatus 120. When the warning signal WR is received, the process may proceed to step S230. When the warning signal WR is not received, the process may proceed to step S240.

At step S230, the memory controller 110 may determine another address AD to be transmitted to the memory apparatus 120. Then, the process may proceed to step S210. Namely, the memory controller 110 may transmit another address AD to the memory apparatus 120 for the ECC test operation.

At step S240, the memory controller 110 may determine whether the result RECCT of the ECC test operation is received from the memory apparatus 120. When the result RECCT of the ECC test operation is not received, step S240 may be repeated. When the result RECCT of the ECC test operation is received, the process may proceed to step S250.

At step S250, based on the result RECCT of the ECC test operation, the memory controller 110 may determine whether the ECC circuit 128 normally operates.

At step S260, the memory controller 110 may separately store the address AD in order to transmit the address AD to the memory apparatus 120 when the ECC test operation is performed again later.

While various embodiments have been described above, it will be understood to those skilled in the art that the embodiments described are examples only. Accordingly, the memory apparatus and the semiconductor system including the same described herein should not be limited based on the described embodiments.

What is claimed is:

1. A memory apparatus comprising:
a plurality of redundancy regions; and
a redundancy address check circuit configured to determine whether a test redundancy address is usable for an error correcting code (ECC) test operation by comparing the test redundancy address with a reference address, among a plurality of redundancy addresses, corresponding to the redundancy regions.

2. The memory apparatus according to claim 1, wherein the reference address is a redundancy address, among the plurality of redundancy addresses, which was most recently used to replace a failed address.

3. The memory apparatus according to claim 1, further comprising:

a read/write circuit configured to, when it is determined that the test redundancy address is usable for the ECC test operation, store data in a redundancy region that corresponds to the test redundancy address.

4. The memory apparatus according to claim 1, further comprising:

an address decoding circuit configured to output an internal address and the test redundancy address based on an address that is transmitted from a memory controller; and an address selection circuit configured to output any one of the internal address and the test redundancy address in response to a redundancy select signal that is output from the redundancy address check circuit.

5. A semiconductor system comprising:

a memory apparatus with an ECC circuit, the memory apparatus configured to perform an ECC test operation for the ECC circuit; and a memory controller configured to transmit an address to the memory apparatus for the ECC test operation, wherein the memory apparatus determines a test redundancy address that corresponds to the address, compares the test redundancy address with a reference address among a plurality of redundancy addresses, and outputs a warning signal to the memory controller when it is determined that the test redundancy address is unusable for the ECC test operation based on a comparison result.

6. The semiconductor system according to claim 5, wherein the memory controller transmits another address to the memory apparatus for the ECC test operation when the warning signal is received from the memory apparatus.

7. The semiconductor system according to claim 5, wherein, when receiving a result of the ECC test operation, instead of the warning signal from the memory apparatus, the memory controller stores the address and transmits the stored address to the memory apparatus when the ECC test operation is performed again.

8. The semiconductor system according to claim 5, wherein the memory apparatus determines whether the test redundancy address is usable for the ECC test operation by determining whether the test redundancy address is replacing a failed address.

9. The semiconductor system according to claim 5, wherein, when it is determined that the test redundancy address is usable for the ECC test operation, the memory apparatus performs the ECC test operation by storing data in a redundancy region that corresponds to the test redundancy address.

10. An operating method of a memory apparatus, the operating method comprising:

comparing a test redundancy address with a reference address among a plurality of redundancy addresses;

storing data including an error in a redundancy region corresponding to the test redundancy address according to a comparison result;

reading stored data from the redundancy region;

performing an error correction operation on read data; and outputting a result of the error correction operation.

11. The operating method of claim 10, wherein the reference address is a redundancy address which was most recently used to replace a failed address.

12. The operating method of claim 10, wherein the comparing the test redundancy address with the reference address includes determining whether the test redundancy address is later in an address order than the reference address, when the plurality of redundancy addresses are used in the address order to replace a failed address.

13. The operating method of claim 12, wherein the storing the data includes storing the data when it is determined that the test redundancy address is later in the address order than the reference address.

14. The operating method of claim 10, wherein the comparing the test redundancy address with the reference address includes determining whether the test redundancy address is earlier in an address order than the reference address, when the plurality of redundancy addresses are used in a reverse order of the address order to replace a failed address.

15. The operating method of claim 14, wherein the storing the data includes storing the data when it is determined that the test redundancy address is earlier in the address order than the reference address.

* * * * *